United States Patent [19]

Gardner

[11] Patent Number: 4,713,355
[45] Date of Patent: Dec. 15, 1987

[54] BIPOLAR TRANSISTOR CONSTRUCTION
[75] Inventor: Neal F. Gardner, Redondo Beach, Calif.
[73] Assignee: TRW Inc., Redondo Beach, Calif.
[21] Appl. No.: 885,614
[22] Filed: Sep. 8, 1986

Related U.S. Application Data

[60] Division of Ser. No. 600,707, Apr. 16, 1984, Pat. No. 4,631,568, which is a continuation-in-part of Ser. No. 473,382, Mar. 8, 1983, abandoned.

[51] Int. Cl.⁴ .................. H01L 21/425; H01L 21/441
[52] U.S. Cl. ..................................... 437/31; 437/178; 437/228
[58] Field of Search ............. 29/578, 591, 580, 576 E, 29/576 B; 148/175, 187

[56] References Cited

U.S. PATENT DOCUMENTS

| | | | |
|---|---|---|---|
| 3,671,340 | 6/1972 | Irie et al. | 357/34 X |
| 3,904,450 | 9/1975 | Evans et al. | 148/175 X |
| 4,151,006 | 4/1979 | DeGraff et al. | 148/188 X |
| 4,233,337 | 11/1980 | Friedman et al. | 148/1.5 X |
| 4,303,933 | 12/1981 | Horng et al. | 357/50 |
| 4,481,706 | 11/1984 | Roche | 29/576 E |
| 4,495,010 | 1/1985 | Kranzer | 148/175 |
| 4,539,742 | 9/1985 | Kanzaki et al. | 148/175 X |
| 4,631,568 | 12/1986 | Gardner | 357/49 |

OTHER PUBLICATIONS

Osburn, C. M., Tsai, M. Y. and Zirinsky, S., "Self-Aligned Silicide Conductors in FET Integrated Circuits," IBM Technical Disclosure Bulletin, vol. 24, No. 4, Sep. 1981.

Primary Examiner—George T. Ozaki
Attorney, Agent, or Firm—Noel F. Heal; Robert J. Stern

[57] ABSTRACT

A bipolar transistor structure and process for its manufacture. The structure includes an emitter region formed over a base region, and a thin wall of insulating material, such as a thermal oxide, along the edge of the emitter region. The wall of insulating material electrically isolates emitter and base contact areas, and greatly reduces the size of inactive portions of the base region, thereby reducing the base resistance and base-collector capacitance, an increasing the speed of operation of the transistor. The wall of insulating material is formed by a process that eliminates at least one photolithographic patterning and etching operation found in conventional processes. In a preferred embodiment of the invention, the emitter region is shaped to include a wide inactive region and an active region of which a portion has reduced width. This configuration provides for lower emitter resistance, but maintains a relatively long active emitter perimeter, which keeps the base resistance also low.

22 Claims, 37 Drawing Figures

Prior Art

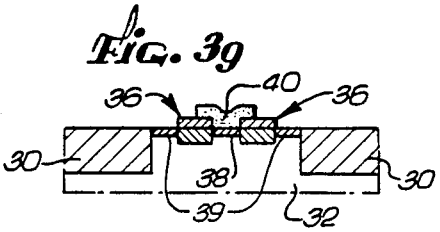
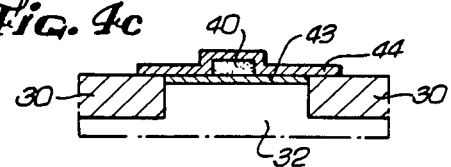
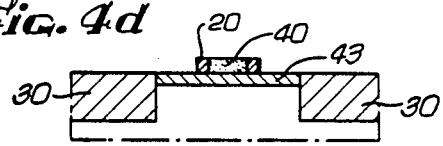
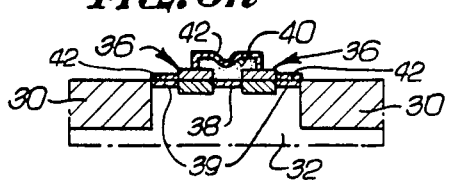
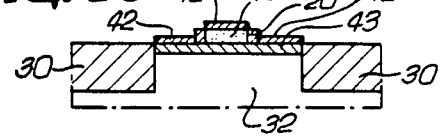
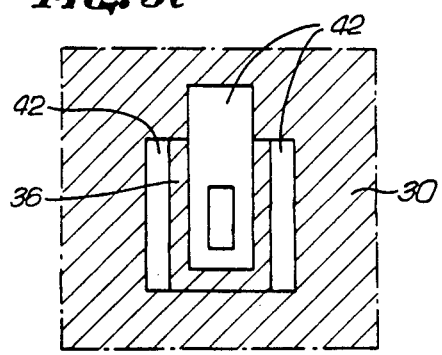
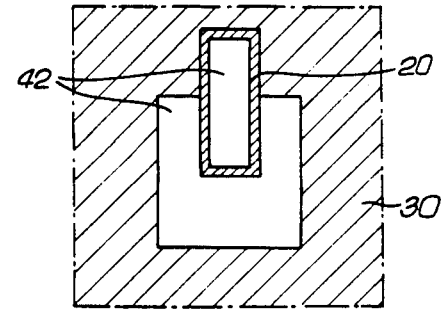
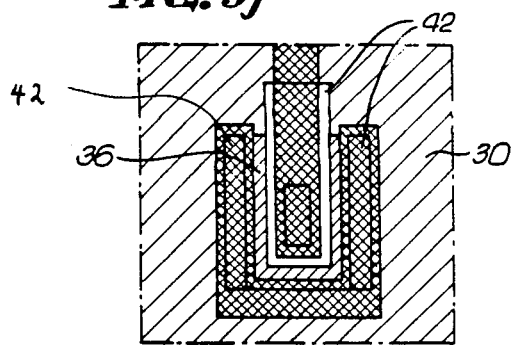
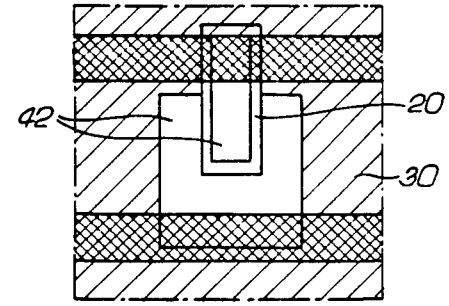

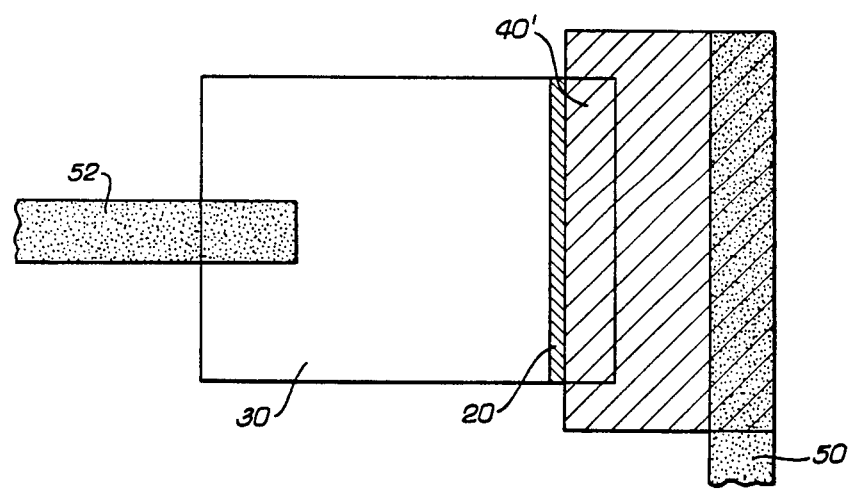
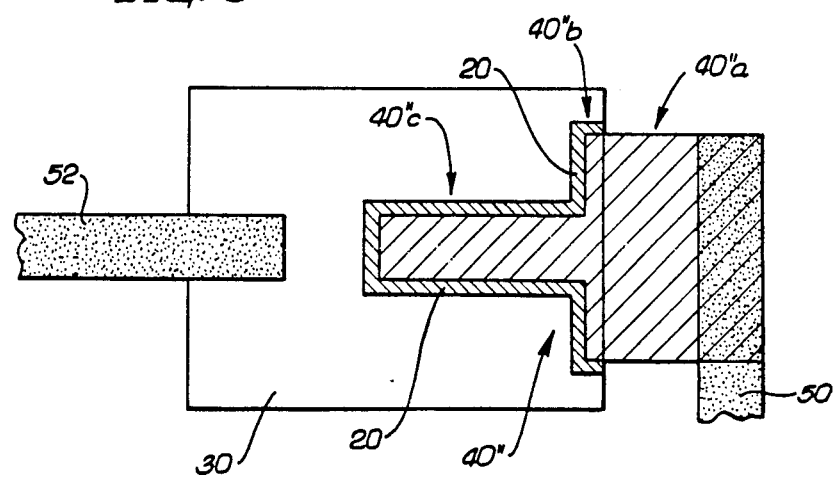

BIPOLAR TRANSISTOR CONSTRUCTION

This invention was made with Government support under Contract No. N00014-83-C-0029 awarded by the Dept. of the Navy. The Government has certain rights in this invention.

CROSS-REFERENCE TO RELATED APPLICATION

This is a division of application Ser. No. 600,707, filed Apr. 16, 1984, now U.S. Pat. No. 4,631,568, which is a continuation-in-part of abandoned application Ser. No. 473,382, filed on Mar. 8, 1983, and having the same title.

BACKGROUND OF THE INVENTION

This invention relates generally to techniques for the fabrication of integrated circuitry. More particularly, the invention relates to an improved construction for bipolar transistors in integrated circuits.

By way of general background, in bipolar transistors two types of current carriers, electrons and "holes," are involved in the conduction mechanism of the device. This is to be contrasted with unipolar devices, in which only a single carrier type is predominantly involved. A bipolar integrated circuit typically comprises many interconnected bipolar transistors, each of which is a three-terminal device having a base region, a collector region and an emitter region. There is one semiconductor junction between the base and emitter regions, and another junction between the base and collector regions. The collector and emitter regions of a transistor are doped with impurities that are of the same conductivity type, n-type or p-type, and the base region is of the opposite conductivity type. The transistor is then said to be of the n-p-n or the p-n-p type. The theory of operation of bipolar transistors is well known and will not be discussed in this specification.

In the fabrication of integrated circuits, many transistors are formed simultaneously, together with an isolation structure formed between adjacent transistors to prevent any unintended interaction between the devices. The isolation may, for example, take the form of a region of silicon dioxide, which is a conveniently available electrical insulator when the semiconductor materials comprise silicon. During the fabrication process, all of the base regions are formed in a single process step or related sequence of steps. Likewise, all of the emitter regions are formed in one step or series of steps, and there is typically a final metallization step in which electrical connections are made to the terminals of the transistors, by means of a patterned layer of metal formed over the circuit.

The formation of layers and patterned regions on an integrated circuit is effected by a variety of conventional process steps. Desired patterns are usually formed by means of photolithographic techniques, used in conjunction with patterned masks. The degree of precision with which the masks can be aligned with the circuit being fabricated typically limits the minimum feature geometry of the circuit. In a process having a number of such alignment steps, circuit features less than a few microns in width are difficult to achieve with consistency. It is therefore always desirable to reduce the number of photolithographic steps in the overall process, so that the complexity and cost of the technique can be minimized, and the circuits can be scaled down without affecting the yield of acceptable circuits resulting from the process.

In conventional bipolar transistor fabrication processes, at least two photolithographic operations are involved. The sequence of operations may vary from one process to another, but two photolithographic steps are almost invariably needed. Typically, one such step is employed to define the locations of emitter regions and the other is to define the locations of base contacts. A further photolithographic operation is usually required to define the areas of metallization over the circuit.

A significant limitation of conventional bipolar fabrication is the high-frequency performance of the resulting circuitry. It is well known that there are certain circuit parameters of bipolar transistors that affect the speed of operation and performance at high frequencies. Two of the most significant of these parameters are the base resistance and the base-collector capacitance. Reduction of either or both of these parameters results in improved speed and high-frequency performance.

For large-scale integrated circuitry, the usual design objectives, in addition to high speed, include high packing density and a simplified fabrication process. Many approaches have been used in an effort to reach these goals, but none appears to have been completely successful. There has therefore been a need for a bipolar transistor construction that provides transistors with improved high-speed performance, while at the same time simplifying the fabrication process and allowing substantially greater device packing densities. The present invention fulfills this need.

SUMMARY OF THE INVENTION

The present invention resides in an improved bipolar transistor structure and a related method for its manufacture. Use of the method of the invention eliminates at least one photolithographic operation in the fabrication process, and allows for the spacing between emitter and base contacts to be greatly reduced, thereby increasing the device packing density, which is the number of transistors per unit circuit area. Perhaps even more importantly, the invention provides transistors with a substantially reduced base resistance and base-collector capacitance. Reduction in the values of these parameters results in a significantly improved performance at high frequencies.

Basically, the structure of the invention achieves these goals by means of a thin wall of insulating material formed along the edge of an emitter region that partly overlaps a base region of a transistor. The thin wall is formed without any separate photolithographic step, and is thin enough that it greatly reduces the size of inactive portions of the base region. Consequently, the base resistance is reduced, as is the base-collector capacitance. Reduction of these parameters increases the speed of operation of the transistor. The smaller inactive base area also results in a higher device packing density.

In general terms, the transistor structure of the invention comprises a collector region formed from a semiconductor material having a first conductivity type, a base region formed over the collector region, from a semiconductor material having the opposite conductivity type to that of the collector region, an emitter region formed to overlap a selected mid-portion of the base region, from a semiconductor material of the same conductivity type as the collector region, and a wall of insulating material formed on the base region in contact with the edges of the emitter region. The wall of insulating material has a height approximately equal to the thickness of the emitter region. The structure further includes a conductive layer formed over the base region and the emitter region but not over the wall of insulating material. The conductive layer serves to establish separate electrical connections to the base region and the emitter region.

In the structure of the invention, the inactive base area may be reduced by a factor of ten or more in comparison with conventional bipolar structures. For example, in a comparable conventional bipolar structure the inactive base region on each side of the emitter region is approximately six microns ($6 \times 10^{-6}$ meter), while the thickness of the insulating wall in the structure of the invention may be as small as 0.2 to 0.5 micron. In accordance with another aspect of the invention the inactive portions of the base region, including portions with which ohmic contact is made, are heavily doped to further reduce the base resistance of the transistor.

In a preferred embodiment of the invention, the emitter resistance is kept to a relatively low level without suffering an increase in base resistance, or any other degradation in transistor performance. Specifically, the emitter region is preferably formed to include a relatively wide inactive portion, not overlapping the base region, and an adjoining active portion with two identifiable areas. The first area of the active portion has substantially the same width as the inactive portion, to provide a relatively low emitter resistance. The second area of the active portion is contiguous with the first but is much narrower, so that the total emitter perimeter is relatively long in relation to its area, which keeps the base resistance low.

In accordance with the method of the invention, the processing steps include forming a base region over a collector region, forming an appropriately patterned emitter region over the base region, and forming a wall of insulating material on the base region along the edges of the emitter region. When a conductive layer is next deposited over the device, conventional processing steps are employed to provide separate contact areas to the base and emitter regions, which are separated by the wall of insulating material. In the preferred process, an oxidation masking material is deposited over the emitter layer; then the emitter layer and the overlying masking layer are selectively patterned to define an emitter region for the device, the emitter material being slightly undercut beneath the patterned edges of the masking layer. Before forming the emitter layer, it is preferable to first apply a very thin additional layer of oxide over the base. This allows the emitter material to be undercut, beneath the edge of the patterned masking layer, without inadvertently removing any base material.

In accordance with another aspect of the invention, another thin oxide layer is applied over the emitter layer, and is etched away after the overlying masking layer has been patterned and etched. This oxide layer is undercut, beneath the edges of the remaining masking layer, and facilitates forming an undercut in the emitter layer without prolonged etching.

Preferably, the step of selectively patterning the emitter layer includes forming a relatively wide inactive portion not overlapping the base region, and forming an active portion that includes a first area contiguous with and as wide as the inactive portion, for reduced emitter resistance, and a second area contiguous with the first area of reduced width, to provide a relatively long emitter perimeter and therefore a reduced base resistance.

In the next step, an oxide layer is formed over the semiconductor base surface, but not over the emitter region, which is masked by the overlying oxidation-masking layer. The next step is a directionally preferential oxidation removal step, in which the masking layer prevents removal of the oxidation layer immediately adjacent to the emitter region, but the oxidation layer over the remainder of the base region is removed. Then the remaining portion of the masking layer is also removed, leaving only the defined emitter region and a surrounding sidewall of insulating oxide.

As an alternative to the foregoing steps, the emitter region can be selectively patterned without applying the masking layer. An electrically insulating layer is then applied over the entire base and emitter surfaces, including the edges of the emitter region. Next the insulating layer is removed by a directionally preferential technique, such as etching, leaving the desired insulating sidewall, as in the preferred method described above.

The remaining steps of the process are conventional. A metal film is deposited over the enitre device, including the base region, the emitter region and the sidewall of insulating material. The metal film is then sintered to the semiconductor materials of the device, leaving unsintered metal still deposited over the wall of insulating material. This unsintered metal is etched away to expose the walls, which electrically isolate the separate conductive layers over the base and emitter regions. The remaining steps in the fabrication process are conventional metallization steps, by means of which electrical contacts are established with the transistor terminals, through the sintered metal layers.

It will be appreciated from the foregoing that the present invention represents a significant advance in the field of bipolar integrated circuit fabrication. In particular, the invention provides a bipolar circuit with lower base resistance, lower base-collector capacitance, and therefore improved high-frequency performance. In addition, the technique of the invention reduces the base region area and thereby increases the device packing density. Moreover, in one preferred form of the invention the emitter resistance is kept to a low level without an increase in base resistance. Most importantly, all these advantages are obtained without any increase in the complexity of the fabrication process. On the contrary, the process is significantly simplified in the invention. Other aspects and advantages of the invention may be better understood from the following more detailed description, taken in conjunction with the accompanying drawings.

BRIEF DESCRIPTION OF THE DRAWINGS

FIGS. 3a–3h are a sequence of sectional views showing the steps of a conventional bipolar fabrication process;

FIGS. 3i and 3j are plan views of the device fabricated by the steps shown in FIGS. 3a–3h, before and after a metallization step, which is not shown;

FIGS. 4a–4e are a sequence of sectional views showing how the processing steps of FIGS. 3a–3h are modified in accordance with one embodiment of the invention;

FIGS. 4f and 4g are plan views of the device fabricated by the steps shown in FIGS. 4a–4e, before and after a metallization step, which is not shown;

FIG. 5 is a plan view of the device modified to have a relatively wide emitter region, to reduce emitter resistance; and FIG. 6 is a plan view of a preferred form of the device, modified to have an emitter region that provides reduced emitter resistance without any significant effect on base resistance.

DESCRIPTION OF THE PREFERRED EMBODIMENTS

Figure 1A:
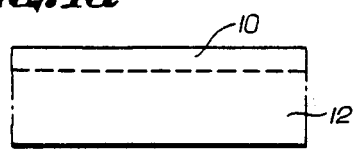
FIGS. 1a–1i are a sequence of sectional views showing the processing steps of the preferred embodiment of the method of the present invention.
Figure 2A:
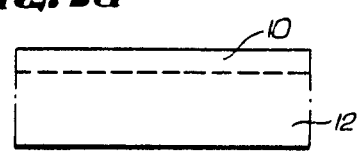
FIGS. 2a–2i are a sequence of sequential views showing the processing steps of an alternate embodiment of the invention.

As shown in the drawings for purposes of illustration, the present invention is concerned with improvements in the manufacture of bipolar transistor circuits. Bipolar transistor circuits are inherently limited in speed of operation, and therefore in their usefulness in high-frequency applications. In accordance with the present invention, the speed of operation of bipolar transistors is greatly increased, by a technique that also has other important advantages. In particular, the overall size of the base region of each transistor is substantially reduced, the fabrication process is simplified, and the device packing density is increased as a result of use of the new technique.

As shown in FIG. 1a, the transistor structure of the invention is fabricated by first forming a semiconductor base layer, indicated by reference numeral 10, in a semiconductor material that will serve as the collector region 12 of the device. As is conventional, the base layer and collector region are of opposite conductivity types. For example, if the collector is of n-type material the base layer will be of p-type material. The semiconductor material used is not critical to the invention in its broadest sense. It could, for example be silicon doped with a suitable impurity to provide the desired conductivity type. Furthermore, the base layer 10 could be formed by any conventional technique, such as ion implantation.

The collector 12 may be of any type conventionally used for bipolar processing, such as a lightly doped epitaxial material on a heavily doped buried layer (not shown). Moreover, the collector 12 may be one of a number of collector regions on a single semiconductor wafer, separated by any conventional isolation technique, such as diffused isolation (not shown).

Figure 1B:
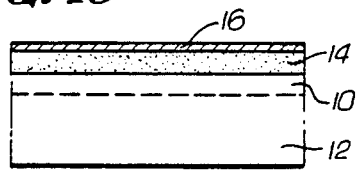
Figure 2B:
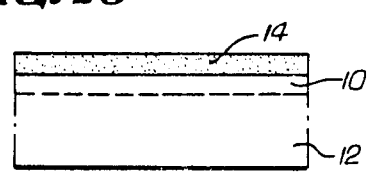

The next step in the process is to form an emitter layer 14 over the base layer 10, as shown in FIG. 1b. The emitter layer 14 has the same conductivity type as the collector region 12, and may be formed by any conventional process, such as diffusion, ion implantation, epitaxial deposition, or polysilicon deposition. Furthermore, the emitter material may be different from that of the collector and base. For example, polysilicon or semi-insulating polysilicon (SIPOS) may be used over a silicon substrate. As also shown in FIG. 1b, a film 16 is deposited over the emitter layer 14. The film 16, which is used later for oxidation masking, may be silicon nitride ($Si_3N_4$), if silicon materials are used, formed by chemical vapor deposition. The purpose of the film is to provide a mask for a subsequent oxidation step.

Figure 1C:
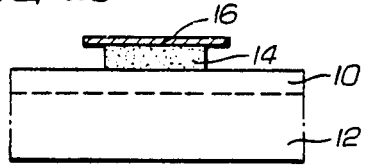
Figure 2C:
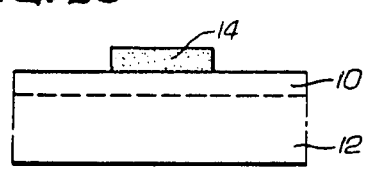

In the next step, shown in FIG. 1c, the film 16 is patterned and etched to define an emitter region of the transistor. Then the emitter layer itself is also etched, and the film is undercut by a controlled amount. This leaves the film extending over the edge of the remaining emitter region by a small distance. The patterning and etching of the emitter region may be performed by conventional photoresist techniques and selective etching. It is desirable that the etched away portions of the emitter layer 14 are completely removed, but that none of the underlying base layer is removed. This can be a difficult goal to achieve without the use of a thin additional layer (not shown) formed between the base 10 and the emitter layer 14. The thin additional layer can be an oxide, for example, which will facilitate etching of the emitter layer right down to the base region 10.

The step of etching the emitter layer 14, and undercutting the silicon nitride film 16 as shown in FIG. 1c, can be further facilitated by the use of another thin oxide layer formed between the emitter 14 and film 16. After the film 16 is patterned and etched, this oxide layer is etched and undercut with an etchant that does not react with the emitter material. The undercutting of this oxide layer exposes the upper surface of the emitter material 14 in the undercut areas beneath the edges of the film 16. When the emitter 14 is etched, a desired degree of undercut is obtained without prolonged exposure to the etchant, and there is less risk of damage to the base region 10.

Figure 1D:
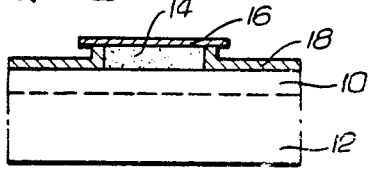
Figure 2D:
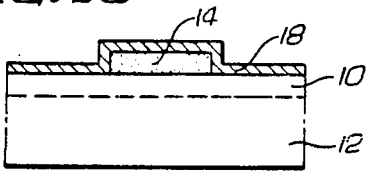
Figure 1E:
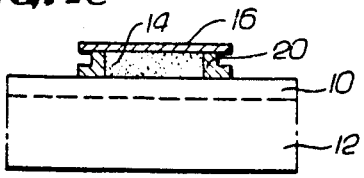
Figure 2E:
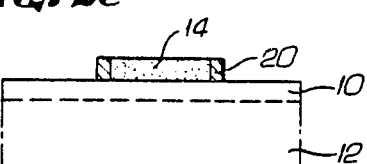
Figure 1F:
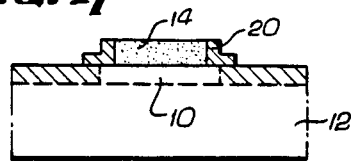
Figure 2F:
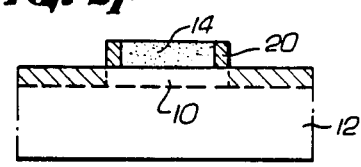

In the next step, shown in FIG. 1d, a thermal oxide layer 18 is formed on the semiconductor surfaces but not on the masking film 16. Then, as shown in FIG. 1e, the oxide layer is etched away with a directionally preferential technique, in a direction normal to the planar surface of the oxide layer. The directionally preferential technique may be, for example, sputter etching or plasma assisted chemical vapor etching. The film 16 acts as a mask in the preferential etching process, and a sidewall 20 of the insulating oxide material remains adjacent to the edge of the emitter region 14. Next, the remaining portion of the masking film 16 is removed by etching, and portions of the base layer 10 not beneath the emitter may be further doped to reduce their resistance. These portions are referred to as the "inactive base" regions. This doping may be accomplished by a technique such as ion implantation, with the emitter material acting as an implantation mask for every part of the base but the inactive base.

Figure 1G:
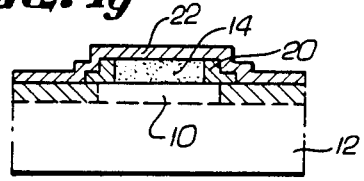
Figure 2G:
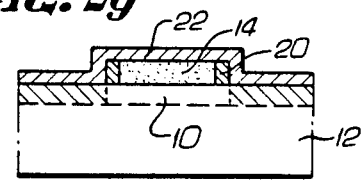

The remaining steps of the process are conventional. A metal film 22 is deposited over the entire structure, as shown in FIG. 1g, including the emitter region 14 and the inactive portions of the base 10. Basically, the metal film must have three properties. It must be able to be sintered to semiconductor materials to form a low-resistivity film. It must not sinter to the insulating region, i.e., the sidewall 20, separating the emitter from the base. Finally, there must be an etching solution that will remove the unsintered metal and leave the sintered metal intact. Platinum is an example of such a metal for use in silicon technology. Platinum sinters to silicon to form platinum silicide, but not to silicon dioxide or silicon nitride. Unsintered platinum can be etched by boiling aqua regia, without attacking platinum silicide.

Figure 1H:
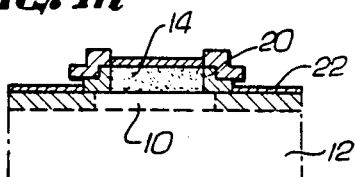
Figure 2H:
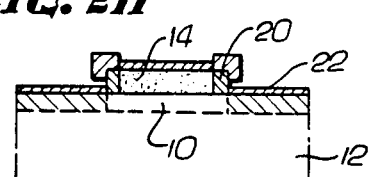
Figure 1I:
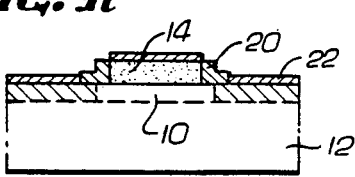
Figure 2I:
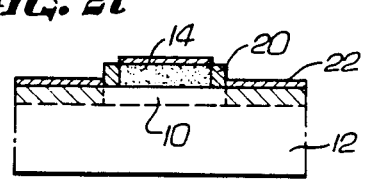

In FIG. 1h, the sintering step has been completed, leaving the sintered metal film over the base 10 and over the emitter region 14, and unsintered metal film over the sidewall 20. In FIG. 1i, the unsintered metal has been etched away to expose the insulating wall 20, which then serves to separate the base and emitter electrical connections. In a final step, which is conventional and not shown, a metallization layer is added to the device, to establish electrical connections to the emitter and base regions.

The thin sidewall 20 of insulating material may be only 0.2 to 0.5 micron in thickness, measured in a direction parallel to the base region surface. This is to be compared with a corresponding dimension of approximately five to six microns in a conventionally fabricated bipolar transistor. This dimension of the base region is basically in the direction of current-carrier flow. Any reduction of the length of the inactive base region is reflected directly in a corresponding decrease in the base resistance of the transistor, and in a decrease in the base-collector capacitance. Since both base resistance and base-collector capacitance directly affect the speed of operation of the transistor, the effect of the invention is to increase the speed of operation.

The reduction in overall size of the base region also means that the entire transistor occupies a significantly smaller area on a semiconductor wafer, and the device packing density may be accordingly increased. Increases in packing density are usually accompanied by increases in the complexity of the fabrication process, or at least by a diminished yield of acceptable circuits. However, use of the present invention actually simplifies the fabrication process, since only one photolithographic operation is required to define both the emitter region and the base contact areas. In conventional processes, at least two photolithographic operations are needed for these purposes.

An alternative to the process of FIG. 1 is illustrated in FIG. 2. As in the first-described embodiment, a base region 10 is formed over a collector region 12, as shown in FIG. 2a. Then the emitter layer 14 is formed (FIG. 2b), but no nitride or other film is deposited over it. Instead, the emitter layer is patterned and etched to define the emitter region position, as shown in FIG. 2c. Then an insulating layer 18, such as an oxide is formed over the entire device, including the base 10 and the emitter region 14, as shown in FIG. 2d. FIG. 2e shows the device after a directionally preferential etching step has removed all of the insulating layer 18 except for the sidewall 20. Once again, the inactive base regions may be more heavily doped at this stage to decrease the base resistance, as indicated in FIG. 2f. The remaining steps are identical with the ones illustrated in FIGS. 1g–1i.

A conventional bipolar fabrication process is shown in FIG. 3, and may be conveniently compared with FIG. 4, which shows the process of the invention as applied to improve the FIG. 3 process. In the conventional process, silicon dioxide wells 30 are formed to surround an n-type epitaxial material 32 that will serve as a collector region of a bipolar transistor. First a silicon nitride film 34 is deposited over the n-type material, as shown in FIG. 3b, and the nitride layer is patterned and etched to define the locations of the base contact regions and an emitter region. The nitride film 34 is etched to provide two openings 36 between the oxide wells 30.

Figure 3A:
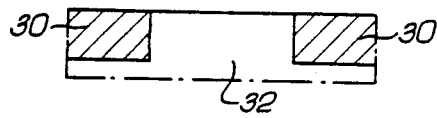
Figure 3B:
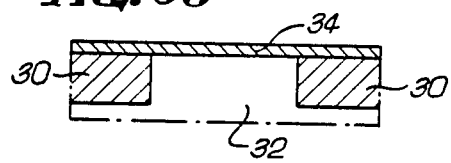
Figure 3C:
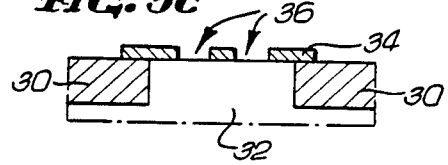
Figure 3D:
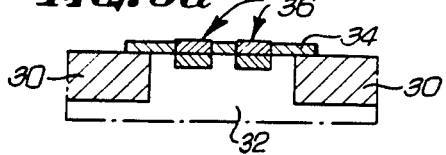
Figure 3E:
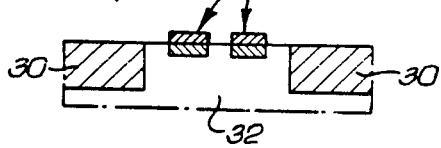
Figure 3F:
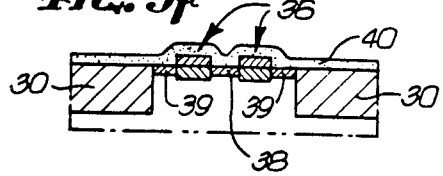

Inactive base regions are formed beneath the openings 36, by diffusion into the n-type material, and oxide is formed over the openings, as shown in FIG. 3d. The nitride film is then stripped, as shown in FIG. 3e, and active base regions and a base contact are implanted in the areas indicated at 38 and 39, respectively, in FIG. 3f. A layer 40 of polysilicon or SIPOS (semi-insulating polysilicon) is deposited over the entire device, and is next patterned to define the emitter of the device, as indicated in FIG. 3g. The SIPOS emitter is then annealed, or the polysilicon emitter material is diffused. It will be noted that two photolithographic operations are required to reach this point in the process. One is to define the base contact and emitter regions, and the second defines the emitter contact area. The inactive base regions have to be relatively wide to allow for any alignment errors in the two patterning operations and still provide for reliable electrical isolation of the emitter and base. In FIG. 3h, platinum 42 has been deposited over the device, then sintered and etched to remove the unsintered metal overlying the oxide areas. FIGS. 3i and 3j show the device in plan view before and after a metallization step has been performed.

Figure 4A:
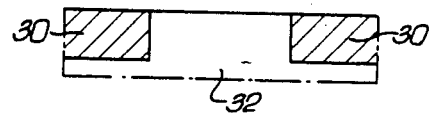
Figure 4B:
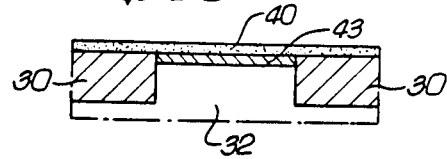

By way of contrast, the method of the invention applied to improve this process is shown in FIGS. 4a–4g. Steps shown in FIGS. 3b–3e are completely eliminated in the improved process. In the step shown in FIG. 4b, an active base layer 43 is implanted over the entire surface of the n-type collector material 32, and a polysilicon or SIPOS layer 40 is deposited. As shown in FIG. 4c, the layer 40 is patterned and etched to define the emitter region, and there is the conventional step of annealing the SIPOS or diffusing the polysilicon. Then, the entire device is covered with an oxide layer 44, most of which is subsequently removed in a directionally preferential etching step, to leave the insulating sidewall 20 at the edges of the emitter region 40, as shown in FIG. 4d. The steps next performed, to reach the structure shown in FIG. 4e, are the same as those performed in the conventional process. A metal film is deposited over the base contact and emitter regions, and is selectively sintered onto the semiconductor surfaces. The unsintered metal overlying the insulating sidewall is removed by etching, and the device is then ready for the final metallization step. FIGS. 4f and 4g are plan views of the device before and after metallization.

It will be apparent from FIGS. 3 and 4 that the process of the invention differs from the corresponding conventional process in that a complex sequence of steps is omitted (FIGS. 3b–3e), and two additional steps are included, namely an oxidation step after the emitter region has been patterned and etched (FIG. 4c), and a directionally preferential etching step (FIG. 4d). FIG. 4 uses the embodiment of the invention illustrated in the sequence shown in FIG. 2. It will be understood that the preferred sequence of FIG. 1 could also be used to modify the conventional process shown in FIG. 3.

The embodiment of the invention described above operates satisfactorily in most respects, and has the important advantage of providing a relatively long active emitter perimeter, and therefore a relatively low base resistance. However, the described embodiment does suffer from one significant drawback. The emitter resistance, as measured between the emitter contact metallization and the emitter-base junction, is too high for some applications of the device. The emitter region 40 is too small to be covered with a conventional metallization layer, such as aluminum. The platinum silicide layer applied over the emitter region to keep the resistance reasonably low still has a sheet resistance that is too high for some applications.

One way of overcoming this difficulty would be to make the entire emitter region much wider, as shown at 40' in FIG. 5. This would also facilitate contact with an emitter contact metallization strip 50. The corresponding base contact metallization strip is indicated at 52. Unfortunately, however, the area of overlap with the base region 30 is then quite critical. If the overlap area is too small, the emitter current density will be excessive, thereby causing an effect known as base pushout or the Kirk effect. This causes an increase in the base transit time and degrades transistor performance. If the overlap between the emitter and base regions is too large, the base resistance becomes too large and device performance is also degraded.

In a preferred embodiment of the invention, the emitter region, indicated at 40″, is shaped as shown in FIG. 6, to provide a combination of the advantages of the configurations of FIGS. 4g and 5. The emitter region 40″ has a wide inactive portion 40″a, which facilitates emitter contact metallization, and an adjoining active portion that has a first area 40″b as wide as the inactive region, and a second narrower area 40″c. The first, wide area 40″b ensures a relatively low emitter resistance, and together with the second area 40″c, provides a relatively long active emitter perimeter, thereby ensuring a relatively low base resistance. Thus the long active emitter perimeter and correspondingly low base resistance of the embodiment of FIG. 4g are retained. In addition, however, the low emitter resistance that is characteristic of the FIG. 5 embodiment is also obtained in the preferred embodiment of FIG. 6.

It will be appreciated from the foregoing that the present invention represents a significant advance in the field of bipolar circuit technology. In particular, the invention provides a bipolar transistor in which the base resistance and the base-collector capacitance have been greatly reduced by minimizing the spacing between the emitter region and the base contact areas. This reduction in spacing not only achieves improved high-speed performance, but also reduces the overall area of each transistor and allows for an increase in the device packing density. In addition, the preferred embodiment of the invention also provides a reduced emitter resistance, without any degradation in other device parameters. Remarkably, these advantages are obtained while at the same time substantially reducing the complexity of the fabrication process by which the device is produced.

It will also be appreciated that, although specific embodiments of the invention have been described in detail for purposes of illustration, various modifications may be made without departing from the spirit and scope of the invention. Accordingly, the invention is not to be limited except as by the appended claims.

I claim:

1. A process for bipolar transistor fabrication, comprising the steps of:
   forming a base region overlying a collector region in a semiconductor material, the base and collector materials having opposite conductivity types;
   forming an appropriately patterned emitter region overlying the base region, of the same conductivity type as the collector region;
   forming a wall of insulating material on the base region and adjacent to the edges of the emitter region; and
   forming a conductive layer over the base and emitter regions but not over the wall of insulating material, whereby the conductive layer serves to establish separate electrical contacts with the base and emitter regions, and the wall of insulating material minimizes the size of inactive portions of the base region.

2. A process as set forth in claim 1, wherein said steps of forming an appropriately patterned emitter region and forming a wall of insulating material include:
   forming an emitter layer over the base region;
   depositing an oxidation-masking film over the emitter layer;
   patterning and etching the emitter region in the oxidation-masking film and in the emitter layer, including undercutting the oxidation-masking film by a controlled amount;
   forming an insulating film over the surfaces of semiconductor materials but not over the oxidation masking film;
   etching the insulating film by a directionally preferential technique that leaves a wall of insulating material at the edges of the emitter region, beneath the undercut edges of the oxidation-masking film; and
   stripping the oxidation-masking film from the emitter region.

3. A process as set forth in claim 2, wherein:
   the process further includes the step of forming an oxide layer over the emitter layer before said depositing step; and
   said step of undercutting the oxidation-masking film includes
      patterning and etching the oxidation-masking film,
      etching the oxide layer from the emitter layer, with a desired degree of undercut beneath the oxidation-masking film, and
      etching the exposed emitter layer, whereby undercutting is achieved without prolonged exposure to etching.

4. A process as set forth in claim 2, and further including the step of:
   further doping portions of the base region not directly beneath the emitter region, to further reduce the base resistance of the transistor.

5. A process as set forth in claim 1, wherein said steps of forming an appropriately patterned emitter region and forming a wall of insulating material include:
   forming an emitter layer over the base region;
   patterning and etching the emitter layer to define the emitter region;
   forming an insulating film over the base and emitter regions; and
   etching the insulating film by a directionally preferential technique that leaves a wall of insulating material at the edges of the emitter region.

6. A process as set forth in claim 5, and further including the step of:
   further doping portions of the base region not directly beneath the emitter region, to further reduce the base resistance of the transistor.

7. A process for bipolar transistor fabrication, comprising the steps of:
   implanting a base region in a silicon semiconductor material, to form a base region over a collector region of opposite conductivity types;
   depositing an emitter layer over the base layer, of the same conductivity type as the collector region;
   depositing a film of silicon nitride over the emitter layer;
   selectively etching the silicon nitride film and the emitter layer to define an emitter region, said selectively etching step including undercutting the edges of the silicon nitride film by a controlled amount;

forming a thermal oxide film over the base region and at the edges of the emitter region, but not over the silicon nitride film;

etching the thermal oxide film by a directionally preferential etching technique, to leave a wall of thermal oxide material at the edges of the emitter region, beneath the undercut edges of the silicon nitride film;

stripping the remaining portions of the silicon nitride film from the emitter region;

depositing a film of platinum over the entire device;

sintering the platinum film to form platinum silicide layers over the emitter region and the base region, leaving unsintered platinum over the wall of oxide material; and etching away the unsintered platinum to expose the wall of oxide material, which electrically isolates the conductive platinum silicide on the emitter and base regions.

8. A process as set forth in claim 7, wherein:

the process further includes the step of forming an oxide layer over the emitter layer before said silicon nitride depositing step; and said step of undercutting the silicon nitride film includes first etching the oxide layer from the emitter layer, with a desired degree of undercut beneath the silicon nitride film, whereby the step of etching the emitter layer can proceed uniformly without prolonged etchant exposure to achieve undercutting.

9. A process as set forth in claim 7, wherein:

the process further includes the step of further doping portions of the base region not directly beneath the emitter region, to further reduce the base resistance of the transistor, after said stripping step.

10. A process for bipolar transistor fabrication, comprising the steps of:

implanting a base region in a silicon semiconductor material, to form a base region over a collector region of opposite conductivity types;

depositing an emitter layer over the base layer, of the same conductivity type as the collector region;

selectively etching the emitter layer to define an emitter region;

forming a thermal oxide film over the base region and at the edges of the emitter region;

etching the thermal oxide film by a directionally preferential etching technique, to leave a wall of thermal oxide material at the edges of the emitter region;

depositing a film of platinum over the entire device;

sintering the platinum film to form platinum silicide layers over the emitter region and the base region, leaving unsintered platinum over the wall of oxide material; and etching away the unsintered platinum to expose the wall of oxide material, which electrically isolates the conductive platinum silicide on the emitter and base regions.

11. A process as set forth in claim 10, wherein:

the process further includes the step of further doping portions of the base region not directly beneath the emitter region, to further reduce the base resistance of the transistor, after said etching step.

12. A process for bipolar transistor fabrication, comprising the steps of:

forming a base region overlying a collector region in a semiconductor material, the base and collector materials having opposite conductivity types;

forming an appropriately patterned emitter region overlying the base region, of the same conductivity type as the collector region;

forming a wall of insulating material on the base region and adjacent to the edges of the emitter region; and forming a conductive layer over the base and emitter regions but not over the wall of insulating material, whereby the conductive layer serves to establish separate electrical contacts with the base and emitter regions, and the wall of insulating material minimizes the size of inactive portions of the base region;

and wherein said step of forming an appropriately patterned emitter region includes forming a wide inactive emitter portion not overlapping the base region, and forming an active emitter region that has a first area contiguous with and approximately as wide as the inactive portion, to provide a relatively low emitter resistance, and a second area adjoining the first, but being narrower to provide a relatively long active emitter perimeter and therefore a relatively low base resistance.

13. A process as set forth in claim 12, wherein said steps of forming an appropriately patterned emitter region and forming a wall of insulating material include:

forming an emitter layer over the base region;

depositing an oxidation-masking film over the emitter layer;

patterning and etching the emitter region in the oxidation-masking film and in the emitter layer, undercutting the oxidation-masking film by a controlled amount;

forming an insulating film over the surfaces of semiconductor materials but not over the oxidation masking film;

etching the insulating film by a directionally preferential technique that leaves a wall of insulating material at the edges of the emitter region, beneath the undercut edges of the oxidation-masking film; and stripping the oxidation-masking film from the emitter region.

14. A process as set forth in claim 13, wherein:

the process further includes the step of forming an oxide layer over the emitter layer before said depositing step; and said step of undercutting the oxidation-masking film includes patterning and etching the oxidation-masking film, etching the oxide layer from the emitter layer, with a desired degree of undercut beneath the oxidation-masking film, and etching the exposed emitter layer, whereby undercutting is achieved without prolonged exposure to etching.

15. A process as set forth in claim 13, and further including the step of:

further doping portions of the base region not directly beneath the emitter region, to further reduce the base resistance of the transistor.

16. A process as set forth in claim 12, wherein said steps of forming an appropriately patterned emitter region and forming a wall of insulating material include:

forming an emitter layer over the base region;

patterning and etching emitter layer to define the emitter region;

forming an insulating film over the base and emitter regions; and etching the insulating film by a directionally preferential technique that leaves a wall of insulating material at the edges of the emitter region.

17. A process as set forth in claim 16, and further including the step of:

further doping portions of the base region not directly beneath the emitter region, to further reduce the base resistance of the transistor.

18. A process for bipolar transistor fabrication, comprising the steps of:

implanting a base region in a silicon semiconductor material, to form a base region over a collector region of opposite conductivity types;

depositing an emitter layer over the base layer, of the same conductivity type as the collector region;

depositing a film of silicon nitride over the emitter layer;

selectively etching the silicon nitride film and the emitter layer to define an emitter region, said selectively etching step including undercutting the edges of the silicon nitride film by a controlled amount;

forming a thermal oxide film over the base region and at the edges of the emitter region, but not over the silicon nitride film;

etching the thermal oxide film by a directionally preferential etching technique, to leave a wall of thermal oxide material at the edges of the emitter region, beneath the undercut edges of the silicon nitride film;

stripping the remaining portions of the silicon nitride film from the emitter region;

depositing a film of platinum over the entire device;

sintering the platinum film to form platinum silicide layers over the emitter region and the base region, leaving unsintered platinum over the wall of oxide material; and etching away the unsintered platinum to expose the wall of oxide material, which electrically isolates the conductive platinum silicide on the emitter and base regions;

and wherein said step of selectively etching to define the emitter region includes forming a wide inactive emitter portion not overlapping the base region, and forming an active emitter region that has a first area contiguous with and approximately as wide as the inactive portion, to provide a relatively low emitter resistance, and a second area adjoining the first, but being narrower to provide a relatively long active emitter perimeter and therefore a relatively low base resistance.

19. A process as set forth in claim 18, wherein: the process further includes the step of forming an oxide layer over the emitter layer before said silicon nitride depositing step; and said step of undercutting the silicon nitride film includes first etching the oxide layer from the emitter layer, with a desired degree of undercut beneath the silicon nitride film, whereby the step of etching the emitter layer can proceed uniformly without prolonged etchant exposure to achieve undercutting.

20. A process as set forth in claim 18, wherein:

the process further includes the step of further doping portions of the base region not directly beneath the emitter region, to further reduce the base resistance of the transistor, after said stripping step.

21. A process for bipolar transistor fabrication, comprising the steps of:

implanting a base region in a silicon semiconductor material, to form a base region over a collector region of opposite conductivity types;

depositing an emitter layer over the base layer, of the same conductivity type as the collector region;

selectively etching the emitter layer to define an emitter region;

forming a thermal oxide film over the base region and at the edges of the emitter region;

etching the thermal oxide film by a directionally preferential etching technique, to leave a wall of thermal oxide material at the edges of the emitter region;

depositing a film of platinum over the entire device;

sintering the platinum film to form platinum silicide layers over the emitter region and the base region, leaving unsintered platinum over the wall of oxide material; and etching away the unsintered platinum to expose the wall of oxide material, which electrically isolates the conductive platinum silicide on the emitter and base regions;

and wherein said step of selectively etching to define the emitter region includes forming a wide inactive emitter portion not overlapping the base region, and forming an active emitter region that has a first area contiguous with and approximately as wide as the inactive portion, to provide a relatively low emitter resistance, and a second area adjoining the first, but being narrower to provide a relatively long active emitter perimeter and therefore a relative low base resistance.

22. A process as set forth in claim 21, wherein:

the process further includes the step of further doping portions of the base region not directly beneath the emitter region, to further reduce the base resistance of the transistor, after said etching step.

* * * * *